(12) United States Patent
Kim

(10) Patent No.: US 7,098,727 B2
(45) Date of Patent: *Aug. 29, 2006

(54) BOOSTING CIRCUIT

(75) Inventor: Eui Suk Kim, Kyungki-Do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/983,383

(22) Filed: Nov. 8, 2004

(65) Prior Publication Data

US 2005/0093487 A1 May 5, 2005

Related U.S. Application Data

(63) Continuation of application No. 10/614,154, filed on Jul. 7, 2003, now Pat. No. 6,836,178.

(30) Foreign Application Priority Data

Jul. 11, 2002 (KR) ................................ 2002-40474

(51) Int. Cl.
*G05F 1/10* (2006.01)
(52) U.S. Cl. ...................... 327/536; 315/291; 315/224; 315/209 R
(58) Field of Classification Search ................ 315/291, 315/224, 209 R; 327/536, 589; 365/185.24
See application file for complete search history.

(56) References Cited

U.S. PATENT DOCUMENTS

| | | | | | |
|---|---|---|---|---|---|
| 5,594,380 | A | * | 1/1997 | Nam | 327/390 |
| 5,940,333 | A | * | 8/1999 | Chung | 365/189.09 |
| 6,141,262 | A | * | 10/2000 | Sudo | 365/189.09 |
| 6,278,639 | B1 | * | 8/2001 | Hosono et al. | 365/189.09 |
| 6,473,321 | B1 | * | 10/2002 | Kishimoto et al. | 363/59 |
| 6,661,710 | B1 | * | 12/2003 | Kwon | 365/185.24 |
| 6,762,970 | B1 | * | 7/2004 | Joo | 365/230.06 |

* cited by examiner

*Primary Examiner*—Tho Phan
*Assistant Examiner*—Chuc Tran
(74) *Attorney, Agent, or Firm*—Marshall, Gerstein & Borun LLP

(57) ABSTRACT

A boosting circuit is provided that includes a reference voltage generating circuit unit to generate a reference voltage, a voltage boosting circuit to output a given boosting voltage, and a sensing circuit to sense a flash memory cell according to the reference voltage and the boosting voltage of the voltage boosting circuit. An output signal of the sensing circuit is changed depending on the boosting voltage of the voltage boosting circuit applied to a gate terminal of the flash memory cell. The boosting circuit also includes a switching circuit to apply the boosting voltage of the voltage boosting circuit or a power supply voltage depending on the boosting voltage of the voltage boosting circuit and the output signal of the sensing circuit.

26 Claims, 3 Drawing Sheets

BOOSTING CIRCUIT

RELATED APPLICATIONS

This application is a continuation and claims priority to earlier filed U.S. application Ser. No. 10/614,154, filed Jul. 7, 2003 now U.S. Pat. No. 6,836,178, which claims priority from Korean Patent application No. 2004-40474 filed Jul. 11, 2002.

BACKGROUND OF THE INVENTION

1. Field of the Invention

The present invention relates to a boosting circuit, and more particularly, to a boosting circuit capable of preventing giving stress to a cell due to a high voltage applied to word lines of the cell, preventing unnecessary consumption of current and securing the read-out margin, wherein a first boosting means and a second boosting means are precharged with a first potential in a standby mode, and the cell current of the flash memory cell is varied according to a boosting potential of the first boosting means in a read-out mode, whereby the output of a flash memory cell sensing circuit unit is changed and the second boosting means is thus boosted to a third potential or a fourth potential.

2. Background of the Related Art

In order to read out the status of cells in flash memory devices for low voltage, it is required that a voltage higher than the operating voltage be applied to the word lines of the cells. For this, a method of boosting the operating voltage to produce a voltage higher than the operating voltage has been employed. If the operating voltage is boosted twice when the operating supply power of the flash memory cell for low voltage is about 1.8~2.4V, the boosting voltage is about 4~5.4V or higher. If the boosting voltage of over 5.5V is applied to the word lines, however, it is almost same to a program verification voltage of about 6V. Due to this, there are problems that the read-out margin could not be secured and the lifetime of the cell is shortened due to stress applied thereto.

SUMMARY OF THE INVENTION

Accordingly, the present invention is contrived to substantially obviate one or more problems due to limitations and disadvantages of the related art, and an object of the present invention is to provide a boosting circuit for producing a boosting voltage by which a read-out margin could be sufficiently secured.

Another object of the present invention is to provide a boosting circuit capable of sufficiently securing the read-out margin and preventing stress from being applied to the cell, using the flash memory cell to control the boosting voltage.

The boosting circuit according to the present invention is characterized in that it comprises a reference voltage generating circuit unit for generating a reference voltage according to an address transition detection signal that is delayed by a given time, a first boosting means for outputting a given boosting voltage according to the address transition detection signal and an inverted signal thereof, a sensing circuit for sensing a flash memory cell according to the reference voltage and the boosting voltage of the first boosting means, wherein the output signal of the sensing circuit is changed depending on the boosting voltage of the first boosting means applied to a gate terminal of the flash memory cell, a switching circuit for applying the boosting voltage of the first boosting circuit or the power supply voltage depending on the boosting voltage of the first boosting circuit and the output signal of the sensing circuit, and a second boosting means for supplying the power supply voltage to an output terminal according to the address transition detection signal, wherein the second boosting means is boosted according to the boosting voltage of the first boosting circuit or the power supply voltage to output the boosting voltages of two levels to the output terminal.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1:
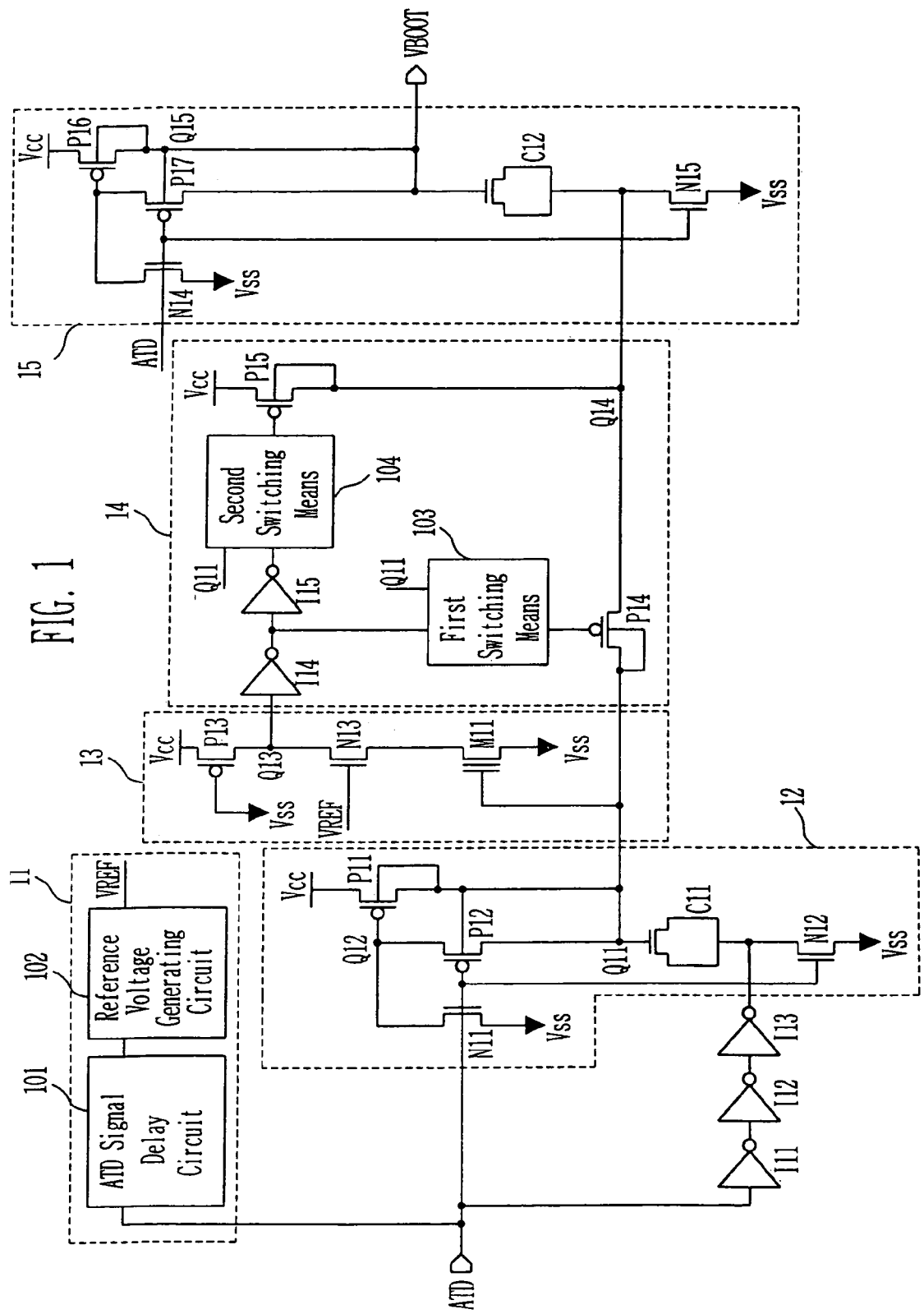
FIG. 1 illustrates a boosting circuit according to the present invention.

Reference will now be made in detail to the preferred embodiments of the present invention, examples of which are illustrated in the accompanying drawings, in which like reference numerals are used to identify the same or similar parts Referring to FIG. 1, a boosting circuit according to the present invention will be below described in detail.

A reference voltage generating circuit unit 11 comprises an address transition detection signal delay circuit 101 for delaying the address transition detection signal ATD by a given time and logically combining it, and a reference voltage generating circuit 102 for generating the reference voltage according to the output signal of the address transition detection signal delay circuit 101.

A first boosting means 12 serves to boost a first node Q11 to a given potential by means of the address transition detection signal ATD and the address transition detection signal ATD delayed through first~third inverters I11~I13. The first boosting means 12 is constructed as follows.

A first PMOS transistor P11 driven by the potential of a second node Q12 is connected between the power supply terminal Vcc and the first node Q11. A first NMOS transistor N11 driven by the address transition detection signal ATD is connected between the second node Q12 and the ground terminal Vss. A second PMOS transistor P12 driven by the address transition detection signal ATD is connected between the second node Q12 and the first node Q11. A first capacitor C11 and a second NMOS transistor N12 are serially connected between the first node Q11 and the ground terminal Vss. At this time, the first capacitor C11 is charged according to the address transition detection signal ATD delayed through the first~third inverters I11~I13 and the second NMOS transistor N12 is driven according to the address transition detection signal ATD. Also, wells of each of the first and second PMOS transistors P11 and P12 are connected to the first node Q11, respectively.

A flash memory cell sensing circuit unit 13 is driven according to a reference voltage VREF and the potential of the first node Q11. Also, the potential of the output voltage of the sensing circuit unit 13 is controlled by the potential of the first node Q11 applied to the gate of the flash memory cell M11. The circuit unit 13 is constructed as follows. A third PMOS transistor P13 the gate terminal of which is connected to the ground terminal Vss is connected between the power supply terminal Vcc and the third node Q13. A third NMOS transistor N13 driven by the reference voltage VREF and a flash memory cell M11 the cell current of which is controlled by the potential of the first node Q11 are serially connected between the third node Q13 and the ground terminal Vss. At this time, the flash memory cell M11 keeps the threshold voltage from which UV is erased, for example 2V.

A switching circuit unit 14 serves to transfer the potential of the first node Q11 or the power supply voltage Vcc to a fourth node Q14 according to the potential of the third node Q13 being the output of the flash memory cell sensing circuit unit 13 and the potential of the first node Q11. The unit 14 is constructed as follows. A first switching means 103 functions to output the potential of the first node Q11 or a voltage of a Low level according to the output signal of the fourth inverter I14 that inverts the potential of the third node Q13. Also, a fourth PMOS transistor P14 is connected between the first node Q14 and the fourth node Q14 and is driven by the output signal of the first switching means 103. Meanwhile, a second switching means 104 serves to output the potential of the first node Q11 or a voltage of a Low level according to the potential of the third node Q13 that is delayed by fourth and fifth inverters I14 and I15. A fifth PMOS transistor P15 is connected between the power supply terminal Vcc and the fourth node Q14 and is driven by the output signal of the second switching means 104. At this time, the well of the fourth PMOS transistor P14 is connected to the first node Q11 and the well of the fifth PMOS transistor P15 is connected to the fourth node Q14.

A second boosting means 15 functions to output the power supply voltage Vcc or a boosting voltage to an output terminal VBOOT by means of the address transition detection signal ATD and the fourth node Q14. The second boosting means 15 is constructed as follows. A sixth PMOS transistor P16 driven by the potential of a fifth node Q15 is connected between the power supply terminal Vcc and the output terminal VBOOT. A fourth NMOS transistor N14 driven by the address transition detection signal ATD is also connected between the fifth node Q15 and the ground terminal Vss. A seventh PMOS transistor P17 driven by the address transition detection signal ATD is connected between the fifth node Q15 and the output terminal VBOOT. Further, a second capacitor C12 and a fifth NMOS transistor N15 are serially connected between the output terminal VBOOT and the ground terminal Vss. At this time, the second capacitor C12 is charged with the potential of the fourth node Q14 and the fifth NMOS transistor N15 is driven by the address transition detection signal ATD. Wells of sixth and seventh PMOS transistors P16 and P17 are each connected to the output terminal VBOOT.

A method of driving the boosting circuit according to the present invention will be now described.

In a standby mode, the address transition detection signal ATD is applied with a Low level. If the address transition detection signal ATD is applied with the Low level, the first and second NMOS transistors N11 and N12 in the first boosting means 12 are turned off and the second PMOS transistor P12 is turned on. Thus the potential of the first node Q11 becomes same to that of the second node Q12. However, the address transition detection signal ATD of the Low level is inverted to a High level through the first~third inverters I11~I13 and the first capacitor C11 is charged by the potential of the High level, whereby the first node Q11 keeps the first potential($\alpha$). Accordingly, the second node Q12 that keeps the potential same to the first node Q11 keeps the potential of the first potential($\alpha$). Due to this, the first PMOS transistor P11 is turned off.

Meanwhile, the reference voltage generating circuit unit 11 having the address transition detection signal delay circuit 101 for delaying the address transition detection signal ATD by a given time and the reference voltage generating circuit 102 for generating the reference voltage according to the output signals of and the address transition detection signal delay circuit 101 outputs the reference voltage VREF of a Low level. Accordingly, as the third NMOS transistor N13 is turned off, the third node Q13 of the flash memory cell sensing circuit 13 keeps the High level. The first switching means 103 of the switching circuit unit 14 outputs a signal of a Low level and the second switching means 104 outputs a signal of the High level, by means of the potential of the third node Q13 keeping the High level. Accordingly, the fifth PMOS transistor P15 is turned off and the fourth PMOS transistor P14 is turned on. Therefore, the potential of the first node Q11 is transferred to the fourth node Q14 and the second capacitor C12 is thus charged with this potential, thereby precharging the output terminal VBOOT with the first potential($\alpha$). At this time, as the address transition detection signal ATD is applied with a Low level, the second boosting means 15 operates same to the first boosting means 12. Thus, the output terminal VBOOT keeps the first potential($\alpha$) same to the first node Q11 and the fourth node Q14.

In a read-out mode, the address transition detection signal ATD is applied with a High level. If the address transition detection signal ATD of the High level is applied, the first and the second NMOS transistors N11 and N12 in the first boosting means 12 are turned on and the second PMOS transistor P12 is turned off. Therefore, the second node Q12 becomes a Low level and the first PMOS transistor P11 is then turned on by the potential of the second node Q12 that keeps the Low stat, so that the power supply voltage Vcc is supplied to the first node Q11. Accordingly, the first node Q11 that was previously precharged with the first potential ($\alpha$) keeps the second potential (Vcc+$\alpha$).

Meanwhile, the reference voltage generating circuit unit 11 having the address transition detection signal delay circuit 101 for delaying the address transition detection signal ATD and the reference voltage generating circuit 102 for generating the reference voltage according the output signal of the address transition detection signal delay circuit 101 outputs the reference voltage VREF of a High level.

Accordingly, as the third NMOS transistor N13 is turned on, the potential of the third node Q13 in the flash memory cell sensing circuit 13 is decided depending on the voltage applied to the gate of the flash memory cell M11. However, if the first node Q11 has about 2.5~3.5V when the first node Q11 has a given voltage applied to the gate of the flash memory cell M11, for example the power supply voltage Vcc has 1.7~2.6V, the flash memory cell sensing circuit 13 determines that the flash memory cell M11 has been programmed. Due to this, the third node Q13 keeps the High level. In other words, as the cell current of the flash memory cell M11 is varied according to the voltage applied to the gate of the flash memory cell M11, the potential of the third node Q13 is varied according to the cell current. Also, as the potential of the third node Q13 keeps the High level, the potential is inverted to a Low level via the fourth inverter 114 and is then inverted to a High level via the fifth inverter 115. Accordingly, the first switching means 103 outputs a signal of the Low level and the second switching means 104 outputs a signal of the High level. Therefore, the fourth PMOS transistor P14 is turned on and the fifth PMOS transistor P15 is turned off. Also, the potential of the first node Q11 that keeps the second potential (Vcc+α) is supplied to the fourth node Q14 through the fourth PMOS transistor P14. The second capacitor C12 is thus charged by the potential of the fourth node Q14 that keeps the second potential (Vcc+α). Meanwhile, as the address transition detection signal ATD is applied with the High level, the second boosting means 15 operates same to the first boosting means 12. Thus, the power supply voltage Vcc is supplied to the output terminal VBOOT. Therefore, the output node VBOOT is applied to the power supply voltage Vcc with it precharged with the first potential(α). Further, as the second capacitor C12 is charged with the second potential (Vcc+α), it keeps a third potential (2Vcc+2α).

Meanwhile, if the first node Q11 has about 3.6~3.9V when the first node Q11 has over a given voltage applied to the gate of the flash memory cell M11, for example the power supply voltage Vcc has 1.7~2.6V, the flash memory cell sensing circuit 13 determines that the flash memory cell M11 has been erased. Thus, the third node Q13 keeps a Low level. As the potential of the third node Q13 keeps the Low level, the potential is inverted to a High level via the fourth inverter I14 and is then inverted to a Low level via the fifth inverter I15. Accordingly, the first switching means 103 outputs a signal of the High level and the second switching means 104 outputs a signal of the Low level. Therefore, as the fourth PMOS transistor P14 is turned off and the fifth PMOS transistor P15 is turned on and the power supply voltage Vcc is thus supplied to the fourth node Q14, the second capacitor C12 is charged by the power supply voltage Vcc. Meanwhile, as the address transition detection signal ATD is applied with the High level, the second boosting means 15 operates same to the first boosting means 12. Thus, the power supply voltage Vcc is supplied to the output terminal VBOOT. Accordingly, the output node VBOOT is applied to the power supply voltage Vcc with it precharged with the first potential(α). Further, as the second capacitor C12 is charged with the potential of the power supply voltage Vcc, it keeps a fourth potential (2Vcc+α).

As described above, in the boosting circuit according to the present invention, the first boosting means and the second boosting means are precharged with the first potential(α) in the standby mode and the first boosting means is boosted with the second potential (Vcc+α) in the read-out mode. At this time, the cell current of the flash memory cell is changed according to the boosting potential of the first boosting means, thus changing the output of the flash memory cell sensing circuit. Thereby the second boosting means is boosted with the third potential (2Vcc+2α) or the fourth potential (2Vcc+α).

Figure 2:
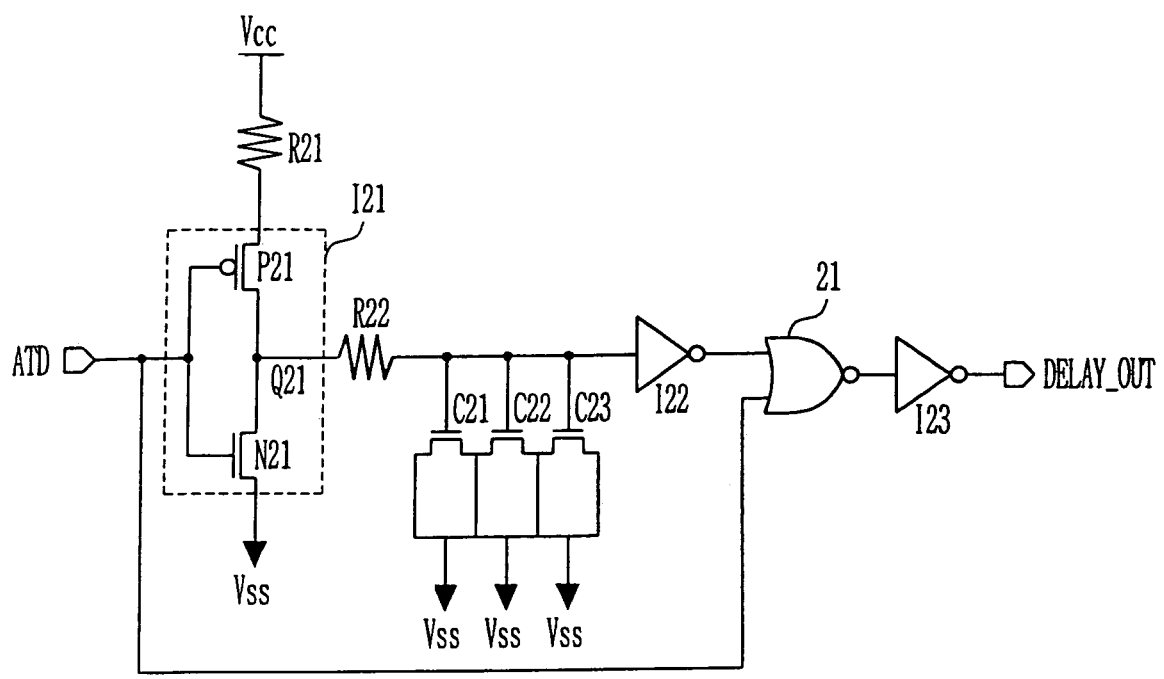
FIG. 2 is a circuit diagram for illustrating one embodiment of an address transition detection signal delay circuit applied to the boosting circuit of the present invention.

FIG. 2 illustrates one embodiment of the address transition detection signal delay unit applied to the boosting circuit according to the present invention.

A first resistor R21 and a first PMOS transistor P21 driven by the address transition detection signal ATD are connected between the power supply terminal Vcc and the first node Q21. A first NMOS transistor N21 driven by the address transition detection signal ATD is connected between the first node Q21 and the ground terminal Vss. The first PMOS transistor P21 and the first NMOS transistor N21 constitute the first inverter I21. A second resistor R22 and a plurality of capacitors C21~C23 are connected to the first node Q21. The potential of the first node Q21 is inverted by the second inverter I22. A NOR gate 21 logically combines the output signal of the second inverter I22 and the address transition detection signal ATD. Thereafter, the output signal of the NOR gate 21 is inverted by the third inverter I23 and is then outputted as a delayed address transition detection signal DELAY_ATD.

A method of driving the address transition detection delay circuit applied to the boosting circuit constructed above according to the present invention will be below described.

If an address is shifted, it is detected and the address transition detection signal ATD is applied with a High level. Also, the address transition detection signal ATD of the High level is delayed through the first and second inverters I21 and I22. The address transition detection signals ATD delayed through the first and second inverters I21 and I22 and the address transition detection signals ATD that have not been delayed are logically combined in the NOR gate 21 and are then outputted as a Low level. Further, a signal of the Low level is inverted to the High level by the third inverter I23, so that the output signal DELAY_OUT is outputted.

Figure 3:
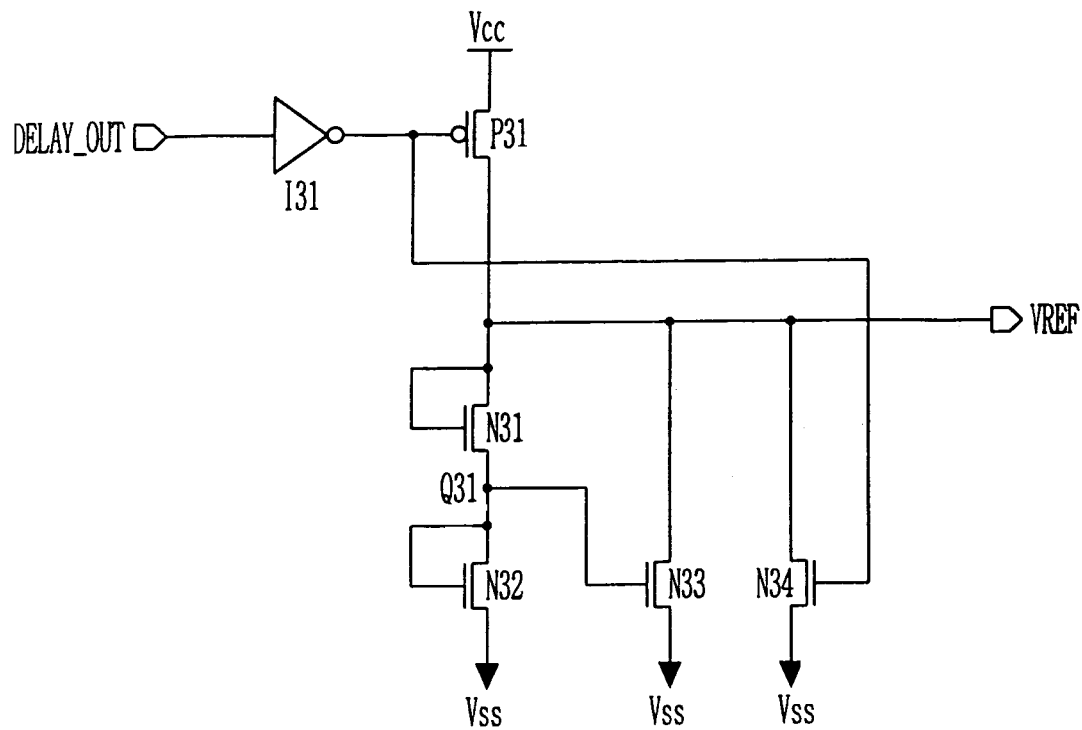
FIG. 3 is a circuit diagram for illustrating one embodiment of a reference voltage generator applied to the boosting circuit of the present invention.

FIG. 3 illustrates one embodiment of the reference voltage generator applied to the boosting circuit according to the present invention.

A first PMOS transistor P31 driven by the output signal of the address transition detection delay circuit, i.e., a signal resulting from the delayed address transition detection signal DELAY_ATD inverted through the first inverter I31 is connected between the power supply terminal Vcc and the output terminal VREF. A first NMOS transistor N31 is connected between the output terminal VREF and a first node Q31. A second NMOS transistor N32 is connected between the first node Q31 and the ground terminal Vss. A third NMOS transistor N33 driven by the potential of the first node Q31 and a fourth NMOS transistor N34 driven by the output signal of the first inverter I31 are connected in parallel between the output terminal VREF and the ground terminal Vss. Meanwhile, the first and second NMOS transistors N31 and N32, which are serially connected, and the third NMOS transistor N33 are connected in parallel. Also, the fourth NMOS transistor N34 is connected in parallel to the first and second NMOS transistors N31 and N32.

A method of driving the reference voltage generator constructed above will be now described.

What an address is shifted is detected. The address transition detection signal is thus inputted with a High level. Accordingly, if the address transition detection delay signal DELAY_ATD is inputted with the High level, the address transition detection delay signal DELAY_ATD is inverted to a Low level by the first inverter I31, thus turning on the first PMOS transistor P31 and turning off the fourth NMOS transistor N34. Therefore, the power supply voltage Vcc is applied to the output terminal VREF via the first PMOS transistor P31. At this time, the potential of the output terminal VREF is determined by the first and second NMOS transistors N31 and N32, which are serially connected, and the third NMOS transistor N33 that are connected in parallel to the NMOS transistors N31 and N32. In other words, the first NMOS transistor N31 is turned on according to the potential of the output terminal VREF that keeps the High level, thus supplying a voltage to the first node Q31. Further, the second and third NMOS transistors N32 and N33 are also turned on by the potential of the first node Q31. Accordingly, the potential of the output terminal VREF is decided by the NMOS transistors N31, N32 and N33.

Figure 4:
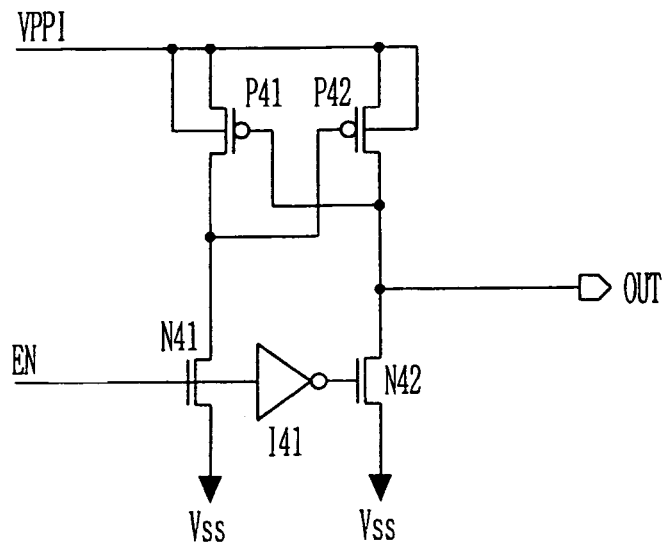
FIG. 4 is a circuit diagram for illustrating one embodiment of a switching means applied to the boosting circuit of the present invention.

FIG. 4 illustrates one embodiment of the first and second switching means applied to the boosting circuit according to the present invention.

A first PMOS transistor P41 driven by the potential of the output terminal OUT is connected between the power supply input terminal VPPI to which the boosting voltage is inputted, and a first node Q41. A first NMOS transistor N41 driven by an input signal IN is connected between the first node P41 and the ground terminal Vss. A second PMOS transistor P42 driven by the potential of the first node Q41 is connected between the power supply input terminal VPPI and the output terminal OUT. A second NMOS transistor N42 driven by the output signal of a first inverter I41 for inverting the input signal IN is connected between the output terminal OUT and the ground terminal Vss. At this time, the input signal IN is an inverted signal of the output of the sensing circuit 13 in case of the first switching means 103 and a delayed signal of the sensing circuit 13 in case of the second switching means 104.

A method of driving the switching means constructed above according to the present will be now described.

If the input signal IN is inputted with a Low level, the first NMOS transistor N41 is turned off. The input signal IN is then inverted to a High level via the first inverter I41, thus turning on the second NMOS transistor N42. Accordingly, the potential of the output terminal OUT becomes a Low level by the second NMOS transistor N42 that was turned on. Thereby, the first PMOS transistor P41 is turned on. Therefore, as the input voltage VPPI is applied to the first node Q41, the first node Q41 keeps the High level and the second PMOS transistor P42 is thus turned off. Thus, the output terminal OUT keeps the Low level.

If the input signal IN is inputted with a High level, the first NMOS transistor N41 is turned on. The input signal IN is then inverted to a Low level via the first inverter I41, thus turning off the second NMOS transistor N42. The potential of the first node Q41 becomes a Low level by the first NMOS transistor N41 that was turned on. Due to this, the second PMOS transistor P42 is turned on. Accordingly, the input voltage VPPI is applied to the output terminal OUT via the second PMOS transistor P42 and the output terminal OUT keeps the potential of the input voltage VPPI.

As mentioned above, according to the present invention, in the standby mode, the first boosting means and the second boosting means are precharged with the first potential and in the read-out mode, the first boosting means is boosted with the second potential. The cell current of the flash memory cell is varied according to the boosting potential of the first boosting means, thus changing the output of the flash memory cell sensing circuit. Thereby, the second boosting means is boosted with the third potential or the fourth potential.

Therefore, the present invention has advantageous effects that it can prevent stress from being applied to the word lines of the cell due to a high voltage applied to the word lines, prevent unnecessary consumption of current and secure the read-out margin.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A boosting circuit, comprising:
   a reference voltage generating circuit unit to generate a reference voltage;
   a voltage boosting circuit to output a given boosting voltage;
   a sensing circuit to sense a flash memory cell according to the reference voltage and the boosting voltage of the voltage boosting circuit, wherein an output signal of the sensing circuit is changed depending on the boosting voltage of the voltage boosting circuit applied to a gate terminal of the flash memory cell;
   a switching circuit to apply the boosting voltage of the voltage boosting circuit or a power supply voltage depending on the boosting voltage of the voltage boosting circuit and the output signal of the sensing circuit.

2. The boosting circuit of claim 1, wherein the reference voltage generating circuit unit is adapted to generate the reference voltage according to an address transition detection signal that is delayed by a given time.

3. The boosting circuit of claim 2, wherein the wherein the reference voltage generating circuit unit comprises:
   an address transition detection signal delay circuit to delay the address transition detection signal by the given time; and
   a sub-reference voltage generating circuit to generate the reference voltage according to the address transition detection signal delayed by the address transition detection signal delay circuit.

4. The boosting circuit of claim 1, wherein the voltage boosting circuit is adapted to output the given boosting voltage according to an address transition detection signal and an inverted signal thereof.

5. The boosting circuit of claim 4, wherein the voltage boosting circuit comprises:
   a first PMOS transistor connected between a power supply terminal and a first node and driven by a potential of a second node;
   a first NMOS transistor connected between the second node and a ground terminal and driven by the address transition detection signal;
   a second PMOS transistor connected between the second node and the first node and driven by the address transition detection signal;
   capacitors connected between the first node and the ground terminal and charged according to the inverted signal; and
   a second NMOS transistor connected between the capacitor and the ground terminal and driven by the address transition detection signal.

6. The boosting circuit of claim 1, further comprising a second voltage boosting circuit to supply a power supply voltage to an output terminal according to an address transition detection signal, wherein the second voltage boosting circuit is responsive to the boosting voltage of the first voltage boosting circuit or the power supply voltage to output boosting voltages of two levels to the output terminal.

7. The boosting circuit of claim 6, wherein the second voltage boosting circuit comprises:
- a first PMOS transistor connected between a power supply terminal and the output terminal and driven by a potential of a first node;
- a first NMOS transistor connected between the first node and a ground terminal and driven by the address transition detection signal;
- a second PMOS transistor connected between the first node and the output terminal and driven by the address transition detection signal;
- capacitors connected between the output terminal and the ground terminal and boosted by the boosting voltage of the first voltage boosting circuit applied through the switching circuit or the power supply voltage; and
- a second NMOS transistor connected between the capacitor and the ground terminal and driven by the address transition detection signal.

8. The boosting circuit of claim 1, wherein the sensing circuit comprises:
- a PMOS transistor connected between the power supply terminal and an output terminal of the sensing circuit, wherein a gate terminal of the PMOS transistor is connected to a ground terminal;
- a NMOS transistor connected between the output terminal of the sensing circuit and the ground terminal and driven by the reference voltage; and
- a flash memory cell driven by the boosting voltage of the voltage boosting circuit.

9. The boosting circuit of claim 1, wherein the switching circuit comprises:
- a first switching circuit to output the boosting voltage of the voltage boosting circuit or a voltage of a Low level according to an inverted signal of an output signal of the sensing circuit;
- a first PMOS transistor to apply the boosting voltage of the voltage boosting circuit according to an output signal of the first switching circuit;
- a second switching circuit to output the boosting voltage of the voltage boosting circuit or a voltage of the Low level according to the output signal of the sensing circuit; and
- a second PMOS transistor to apply the power supply voltage according to an output signal of the second switching circuit.

10. A boosting circuit, comprising:
- a reference voltage generating circuit unit to generate a reference voltage according to an address transition detection signal;
- a first voltage boosting circuit to output a given boosting voltage;
- a sensing circuit to sense a flash memory cell according to the reference voltage and the boosting voltage of the first boosting circuit, wherein an output signal of the sensing circuit is changed depending on the boosting voltage of the first boosting circuit applied to a gate terminal of the flash memory cell;
- a switching circuit to apply the boosting voltage of the first boosting circuit or a power supply voltage depending on the boosting voltage of the first boosting circuit and the output signal of the sensing circuit; and
- a second voltage boosting circuit to supply the power supply voltage to an output terminal according to the address transition detection signal.

11. The boosting circuit of claim 10, wherein the address transition detection signal is delayed by a given time.

12. The boosting circuit of claim 11, wherein the wherein the reference voltage generating circuit unit comprises:
- an address transition detection signal delay circuit to delay the address transition detection signal by the given time; and
- a sub-reference voltage generating circuit to generate the reference voltage according to the address transition detection signal delayed by the address transition detection signal delay circuit.

13. The boosting circuit of claim 11, wherein the second voltage boosting circuit is responsive to the boosting voltage of the first voltage boosting circuit or the power supply voltage to output boosting voltages of two levels to the output terminal.

14. The boosting circuit of claim 13, wherein the second voltage boosting circuit comprises:
- a first PMOS transistor connected between a power supply terminal and the output terminal and driven by a potential of a first node;
- a first NMOS transistor connected between the first node and a ground terminal and driven by the address transition detection signal;
- a second PMOS transistor connected between the first node and the output terminal and driven by the address transition detection signal;
- capacitors connected between the output terminal and the ground terminal and boosted by the boosting voltage of the first voltage boosting circuit applied through the switching circuit or the power supply voltage; and
- a second NMOS transistor connected between the capacitor and the ground terminal and driven by the address transition detection signal.

15. The boosting circuit of claim 10, wherein the first voltage boosting circuit is adapted to output the given boosting voltage according to the address transition detection signal and an inverted signal thereof.

16. The boosting circuit of claim 15, wherein the first voltage boosting circuit comprises:
- a first PMOS transistor connected between a power supply terminal and a first node and driven by a potential of a second node;
- a first NMOS transistor connected between the second node and a ground terminal and driven by the address transition detection signal;
- a second PMOS transistor connected between the second node and the first node and driven by the address transition detection signal;
- capacitors connected between the first node and the ground terminal and charged according to the inverted signal; and
- a second NMOS transistor connected between the capacitor and the ground terminal and driven by the address transition detection signal.

17. The boosting circuit of claim 10, wherein the sensing circuit comprises:
- a PMOS transistor connected between the power supply terminal and an output terminal of the sensing circuit, wherein a gate terminal of the PMOS transistor is connected to a ground terminal;
- a NMOS transistor connected between the output terminal of the sensing circuit and the ground terminal and driven by the reference voltage; and
- a flash memory cell driven by the boosting voltage of the voltage boosting circuit.

18. The boosting circuit of claim 10, wherein the switching circuit comprises:
  a first switching circuit to output the boosting voltage of the first voltage boosting circuit or a voltage of a Low level according to an inverted signal of an output signal of the sensing circuit;
  a first PMOS transistor to apply the boosting voltage of the first voltage boosting circuit according to an output signal of the first switching circuit;
  a second switching circuit to output the boosting voltage of the first voltage boosting circuit or a voltage of the Low level according to the output signal of the sensing circuit; and
  a second PMOS transistor to apply the power supply voltage according to an output signal of the second switching circuit.

19. A boosting circuit, comprising:
  a reference voltage generating circuit unit to generate a reference voltage according to an address transition detection signal;
  a first voltage boosting circuit to output a given boosting voltage according to the address transition detection signal and an inverted signal thereof;
  a sensing circuit to sense a flash memory cell according to the reference voltage and the boosting voltage of the first voltage boosting circuit, wherein an output signal of the sensing circuit is changed depending on the boosting voltage of the first voltage boosting circuit applied to a gate terminal of the flash memory cell;
  a switching circuit to apply the boosting voltage of the first voltage boosting circuit or a power supply voltage depending on the boosting voltage of the first voltage boosting circuit and the output signal of the sensing circuit; and
  a second voltage boosting circuit to supply the power supply voltage to an output terminal according to the address transition detection signal, wherein the second voltage boosting circuit is responsive to the boosting voltage of the first voltage boosting circuit or the power supply voltage.

20. The boosting circuit of claim 19, wherein the address transition detection signal is delayed by a given time.

21. The boosting circuit of claim 20, wherein the wherein the reference voltage generating circuit unit comprises:
  an address transition detection signal delay circuit to delay the address transition detection signal by the given time; and
  a sub-reference voltage generating circuit to generate the reference voltage according to the address transition detection signal delayed by the address transition detection signal delay circuit.

22. The boosting circuit of claim 19, wherein the first voltage boosting circuit comprises:
  a first PMOS transistor connected between a power supply terminal and a first node and driven by a potential of a second node;
  a first NMOS transistor connected between the second node and a ground terminal and driven by the address transition detection signal;
  a second PMOS transistor connected between the second node and the first node and driven by the address transition detection signal;
  capacitors connected between the first node and the ground terminal and charged according to the inverted signal; and
  a second NMOS transistor connected between the capacitor and the ground terminal and driven by the address transition detection signal.

23. The boosting circuit of claim 19, wherein the second voltage boosting circuit is responsive to the boosting voltage of the first voltage boosting circuit or the power supply voltage to output boosting voltages of two levels to the output terminal.

24. The boosting circuit of claim 23, wherein the second voltage boosting circuit comprises:
  a first PMOS transistor connected between a power supply terminal and the output terminal and driven by a potential of a first node;
  a first NMOS transistor connected between the first node and a ground terminal and driven by the address transition detection signal;
  a second PMOS transistor connected between the first node and the output terminal and driven by the address transition detection signal;
  capacitors connected between the output terminal and the ground terminal and boosted by the boosting voltage of the first voltage boosting circuit applied through the switching circuit or the power supply voltage; and
  a second NMOS transistor connected between the capacitor and the ground terminal and driven by the address transition detection signal.

25. The boosting circuit of claim 19, wherein the sensing circuit comprises:
  a PMOS transistor connected between the power supply terminal and an output terminal of the sensing circuit, wherein a gate terminal of the PMOS transistor is connected to a ground terminal;
  a NMOS transistor connected between the output terminal of the sensing circuit and the ground terminal and driven by the reference voltage; and
  a flash memory cell driven by the boosting voltage of the voltage boosting circuit.

26. The boosting circuit of claim 19, wherein the switching circuit comprises:
  a first switching circuit to output the boosting voltage of the first voltage boosting circuit or a voltage of a Low level according to an inverted signal of an output signal of the sensing circuit;
  a first PMOS transistor to apply the boosting voltage of the first voltage boosting circuit according to an output signal of the first switching circuit;
  a second switching circuit to output the boosting voltage of the first voltage boosting circuit or a voltage of the Low level according to the output signal of the sensing circuit; and
  a second PMOS transistor to apply the power supply voltage according to an output signal of the second switching circuit.

* * * * *